United States Patent
Tsubokawa et al.

(10) Patent No.: US 9,074,101 B2
(45) Date of Patent: Jul. 7, 2015

(54) SILOXANE-GRAFTED SILICA, TRANSPARENT SILICONE COMPOSITION, AND OPTOELECTRONIC DEVICE ENCAPSULATED THEREWITH

(75) Inventors: Norio Tsubokawa, Niigata (JP); Toshio Shiobara, Tokyo (JP); Tsutomu Kashiwagi, Annaka (JP)

(73) Assignees: NIIGATA UNIVERSITY, Niigata (JP); SHIN-ETSU CHEMICAL CO., LTD., Tokyo (JP)

( * ) Notice: Subject to any disclaimer, the term of this patent is extended or adjusted under 35 U.S.C. 154(b) by 263 days.

(21) Appl. No.: 12/270,720

(22) Filed: Nov. 13, 2008

(65) Prior Publication Data

US 2009/0121180 A1 May 14, 2009

(30) Foreign Application Priority Data

Nov. 14, 2007 (JP) ................................. 2007-295295

(51) Int. Cl.
| | |
|---|---|
| *C08G 77/06* | (2006.01) |
| *C08F 30/08* | (2006.01) |
| *C09C 1/30* | (2006.01) |
| *B82Y 30/00* | (2011.01) |
| *C01B 33/149* | (2006.01) |
| *C01B 33/18* | (2006.01) |
| *H01L 23/29* | (2006.01) |
| *H05B 33/04* | (2006.01) |

(52) U.S. Cl.
CPC .............. *C09C 1/3081* (2013.01); *B82Y 30/00* (2013.01); *C01B 33/149* (2013.01); *C01B 33/18* (2013.01); *C01P 2004/61* (2013.01); *C01P 2004/62* (2013.01); *C01P 2004/64* (2013.01); *C01P 2006/32* (2013.01); *C01P 2006/60* (2013.01); *H01L 23/295* (2013.01); *H01L 23/296* (2013.01); *H01L 2924/12044* (2013.01); *H05B 33/04* (2013.01); *H01L 2924/0002* (2013.01)

(58) Field of Classification Search
USPC ....... 428/446; 427/162; 524/15, 17; 525/478; 528/15, 17; 526/279
See application file for complete search history.

(56) References Cited

U.S. PATENT DOCUMENTS

| | | | |
|---|---|---|---|
| 3,555,109 A * | 1/1971 | Getson ............................ | 528/25 |
| 5,194,649 A | 3/1993 | Okawa et al. | |
| 5,504,174 A * | 4/1996 | Onishi ............................ | 528/15 |
| 2009/0123764 A1* | 5/2009 | Morita et al. ................. | 428/446 |

FOREIGN PATENT DOCUMENTS

| | | |
|---|---|---|
| EP | 1 947 128 A1 | 7/2008 |
| EP | 1 717 278 A1 | 11/2008 |
| JP | 3-258866 A | 11/1991 |
| JP | 10-284759 A | 10/1998 |
| JP | 3029680 B2 | 2/2000 |
| JP | 2004-179644 A | 6/2004 |
| JP | 2005-524737 A | 8/2005 |
| WO | WO-03/093393 A1 | 11/2003 |
| WO | 2007/048399 A1 | 4/2007 |

OTHER PUBLICATIONS

European Search Report Issued on Dec. 27, 2010. In corresponding European Patent Application No. 08 25 3699.

\* cited by examiner

*Primary Examiner* — Monique Peets
(74) *Attorney, Agent, or Firm* — Birch, Stewart, Kolasch & Birch, LLP

(57) ABSTRACT

Silica particles having 4-30% of an organopolysiloxane grafted to surfaces thereof are provided. A silicone composition loaded with such silica particles has high transparency, minimized permeability to corrosive gases, and improved encapsulation ability.

18 Claims, No Drawings

SILOXANE-GRAFTED SILICA, TRANSPARENT SILICONE COMPOSITION, AND OPTOELECTRONIC DEVICE ENCAPSULATED THEREWITH

CROSS-REFERENCE TO RELATED APPLICATION

This non-provisional application claims priority under 35 U.S.C. §119(a) on Patent Application No. 2007-295295 filed in Japan on Nov. 14, 2007, the entire contents of which are hereby incorporated by reference.

TECHNICAL FIELD

This invention relates to silica particles having an organopolysiloxane grafted to surfaces thereof, a silicone composition loaded with such silica particles and capable of curing into a product having minimized permeability to oxygen and other gases while maintaining transparency, and an optoelectronic device, typically light-emitting diode (LED), encapsulated with the cured silicone composition.

BACKGROUND ART

Silicone compositions find use in a wide variety of applications since their cured products have excellent characteristics including weathering, heat resistance and transparency as well as hardness, elongation and other rubber properties. In particular, silicone resins due to their heat resistance and UV resistance are now in widespread use as encapsulants for optoelectronic devices such as blue or white high-intensity LEDs. However, prior art silicone resins have so high a coefficient of thermal expansion and a gas permeability that they often crack upon thermal cycling, causing disconnection and other troubles. In addition, corrosive gases can penetrate through the encapsulating silicone resin to cause corrosion to the silver surface of a reflector of LED, undesirably resulting in a reduced luminance.

Patent references relating to the present invention include WO 2003/093393 (JP-A 2005-524737), JP-A 2004-179644, and JP-A 10-284759.

DISCLOSURE OF THE INVENTION

An object of the invention is to provide silica particles for use in silicone compositions; a silica-loaded silicone composition which cures into a product having a low coefficient of thermal expansion and minimized gas permeability while maintaining transparency; and an optoelectronic device, typically light-emitting diode (LED), encapsulated with the cured silicone composition so that the device is reliable in that the encapsulant is improved in impact resistance and thermal cycling, and prevents the encapsulated component, typically LED chip, from corrosion with corrosive gases which can otherwise penetrate therethrough.

The inventors have found that when 5 to 400 parts by weight of silica particles whose surfaces have been graft-treated with an organopolysiloxane having the general formula (1), shown below, is added to 100 parts by weight of a total of silane or siloxane components in an addition or condensation cure type silicone composition (that is, the total of (A) an alkenyl-containing organopolysiloxane and (B) an organohydrogenpolysiloxane, or the total of (D) a hydroxyl or hydrolyzable group-terminated organopolysiloxane and (E) a hydrolyzable group-containing silane and/or partial hydrolytic condensate thereof), there is obtained a silicone composition which cures into a product having high transparency, a low coefficient of thermal expansion and minimized permeability to corrosive gases; and that an optoelectronic device, typically light-emitting diode (LED), encapsulated with the cured silicone composition is highly reliable in that the encapsulant is improved in impact resistance and thermal cycling, and prevents the silver surface of a reflector from corrosion with corrosive gases which can otherwise penetrate therethrough, for example.

According to one aspect, the invention provides silica particles having an organopolysiloxane grafted to surfaces thereof in a proportion of at least 4% based on the weight of untreated silica. The organopolysiloxane has the general formula (1):

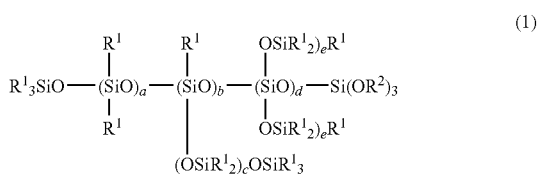

wherein $R^1$ is each independently a substituted or unsubstituted monovalent hydrocarbon group of 1 to 10 carbon atoms, $R^2$ is methyl or ethyl, a is an integer of 1 to 50, b is 0 or 1, d is 0 or 1, c and e each are an integer of 0 to 10, and the sum of a+b+d is an integer of 3 to 52.

Preferably the silica particles have a percent grafting of 4% to 30% and an average particle size of 1 nm to less than 1,000 nm.

According to another aspect, the invention provides a highly transparent silicone composition of the addition or condensation cure type comprising 100 parts by weight of a total of silane or siloxane components, and 5 to 400 parts by weight of silica particles having an organopolysiloxane of formula (1) grafted to surfaces thereof.

Preferably, the silicone composition in the cured state has a light transmittance of at least 80% in a wavelength region of 400 to 800 nm. In one preferred embodiment, the silicone composition is of the addition cure type and comprises (A) an alkenyl group-containing organopolysiloxane, (B) an organohydrogenpolysiloxane, and (C) a platinum group metal based catalyst. In another preferred embodiment, the silicone composition is of the condensation cure type and comprises (D) an organopolysiloxane capped with a hydroxyl or hydrolyzable group at an end of its molecular chain, (E) a silane having at least three silicon-bonded hydrolyzable groups in a molecule or a partial hydrolytic condensate thereof, and (F) a condensation catalyst. The silicone composition may further comprise a phosphor.

Also contemplated herein is an optoelectronic device encapsulated with the silicone composition in the cured state.

BENEFITS OF THE INVENTION

According to the invention, siloxane-grafted silica particles are incorporated in a silicone composition so that the cured silicone composition has high transparency, minimized permeability to corrosive gases, and improved protective encapsulation. The silicone composition loaded with siloxane-grafted silica particles is best suited for the encapsulation of optoelectronic devices, typically LEDs.

DESCRIPTION OF THE PREFERRED EMBODIMENTS

The invention is directed to siloxane-grafted silica. Specifically, an organopolysiloxane of the general formula (1) is grafted to silica.

The silica used herein is in particulate form and includes both wet and dry silicas such as fumed silica and fused silica having a nano-order size, specifically an average particle size of 1 nm to less than 1,000 nm, preferably 5 to 500 nm, and more preferably 10 to 200 nm. For example, use may be made of Aerosil 200 (average particle size 12 nm), Aerosil 300 from Nippon Aerosil Co., Ltd., hydrophobic surface-treated silicas such as Aerosil RX300 from Nippon Aerosil Co., Ltd. and Reolosil HM-30S from Tokuyama Corp., and a silica fraction classified under 200 nm available as Admafine from Admatechs Co., Ltd.

In the prior art, high-strength silicone resins loaded with silicas which have been surface treated with various coupling agents or organopolysiloxanes are known, for example, from Japanese Patent 3029680. These high-strength silicone resins are prepared by kneading silica, a siloxane compound of specific structure, and a silicone resin on a kneader and heat treating the mixture at the same time. The siloxane compound used has a degree of polymerization of 4. Silicone resin compositions of this type are less transparent.

According to the invention, silica particles have an organopolysiloxane of the general formula (1) grafted to surfaces thereof. In case of insufficient grafting, transparency may not be insured, particularly in the short wavelength region.

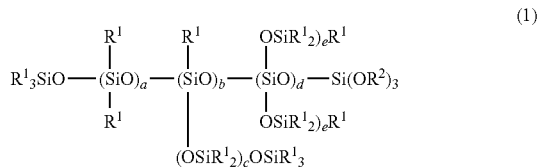

(1)

Herein $R^1$ is each independently a substituted or unsubstituted monovalent hydrocarbon group of 1 to 10 carbon atoms, $R^2$ is methyl or ethyl, the subscript "a" is an integer of 1 to 50, "b" is 0 or 1, "c" is an integer of 0 to 10, "d" is 0 or 1, "e" is an integer of 0 to 10, and the sum of a+b+d is an integer of 3 to 52.

Exemplary monovalent hydrocarbon groups represented by $R^1$ include alkyl groups such as methyl, ethyl, propyl, isopropyl, butyl, isobutyl, tert-butyl, pentyl, neopentyl, hexyl, cyclohexyl, octyl, nonyl and decyl; aryl groups such as phenyl, tolyl, xylyl and naphthyl; aralkyl groups such as benzyl, phenylethyl and phenylpropyl; alkenyl groups such as vinyl, allyl, propenyl, isopropenyl, butenyl, hexenyl, cyclohexenyl and octenyl; substituted forms of the foregoing groups in which some or all hydrogen atoms are substituted by halogen atoms (e.g., fluoro, bromo, chloro), cyano groups or the like, such as chloromethyl, chloropropyl, bromoethyl, trifluoropropyl and cyanoethyl.

Examples of the organopolysiloxane which can be used in surface treatment are given below.

$(CH_3)_3SiO(Si(CH_3)_2O)_{10}Si(OCH_3)_3$ $(CH_3)_3SiO(Si(CH_3)_2O)_{20}Si(OCH_3)_3$ $(CH_3)_3SiO(SiC_6H_5(CH_3)O)_8Si(OCH_3)_3$ $(CH_3)_3SiO(Si(CH_3)_2O)_5(Si(C_6H_5)_2O)_3Si(OCH_3)_3$ $(CH_2\!\!=\!\!CH\!\!-\!\!)(CH_3)_2SiO(Si(CH_3)_2O)_5(Si(C_6H_5)_2O)_3Si(OCH_3)_3$ $(CH_2\!\!=\!\!CH\!\!-\!\!)(CH_3)_2SiO(Si(CH_3)_2O)_{30}Si(OCH_3)_3$

-continued

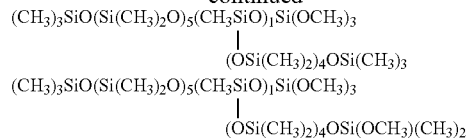

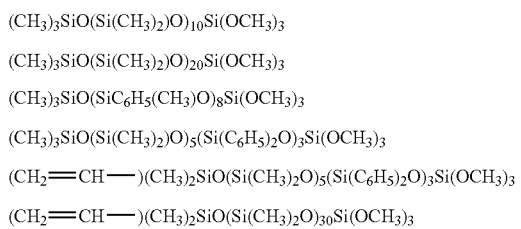

The organopolysiloxanes used herein should have a degree of polymerization of 5 to 54. Note that the degree of polymerization corresponds to the number of silicon atoms contained in siloxane units constituting the main chain. If an organopolysiloxane has a degree of polymerization of less than 5, loading silica having that organopolysiloxane grafted thereto may fail to provide a silicone composition with sufficient light transmittance. An organopolysiloxane having a degree of polymerization in excess of 54 may be less reactive with silica surfaces, requiring a longer time for treatment. The desired degree of polymerization is 6 to 44, and more desirably 10 to 34. It is noted that the organopolysiloxane to be grafted to silica is sometimes referred to as grafting organopolysiloxane in order to distinguish it from the base organopolysiloxane in the composition.

In one embodiment wherein the silicone composition which is to be loaded with silica is based on dimethylpolysiloxane as the organopolysiloxane component, the grafting organopolysiloxane is preferably selected from those in which the substituent groups on silicon are mainly methyl, ethyl or analogs, in order to provide the silicone composition with satisfactory light transmittance. In another embodiment wherein the silicone composition comprises an organopolysiloxane whose substituent groups are mainly phenyl, the grafting organopolysiloxane is preferably tailored to a phenyl content equivalent to that in the composition.

In silicone compositions of the addition reaction cure type, both light transmittance and strength can be achieved using a vinyl-containing organopolysiloxane for grafting.

Grafting reaction of organopolysiloxane to surfaces of silica particles is generally performed by admitting silica particles and the treating agent in a solvent, and heating the mixture under reflux at a temperature of 50 to 200° C. for 1 to 50 hours.

Typical solvents which can be used herein include aromatic solvents such as toluene and xylene, alcohols such as methanol, ethanol and isopropyl alcohol, and ketone solvents such as methyl ethyl ketone and methyl isobutyl ketone. Some solvents may be mixed to form a mixture having a reflux temperature in the range of 50 to 200° C. Other solvents may be used as long as the objects are not impaired.

Grafting reaction is preferably performed by mixing 100 parts by weight of silica with 10 to 50 parts by weight of the treating agent and 100 to 500 parts by weight of the solvent. If the amount of the treating agent is less than 10 pbw, the desired percent grafting may not be reached. More than 50 pbw of the treating agent may require a too much cost for a percent grafting available, and the process thus becomes uneconomical.

At the end of reaction, silica particles having organopolysiloxane grafted on surfaces thereof are readily recovered by separating the particles from the solvent such as by centrifugation, and drying.

For high transparency, a proportion of the treating agent grafted to silica surfaces is preferably at least 4% based on the weight of silica prior to the surface treatment. The percent grafting is more preferably 4 to 30% and even more preferably 5 to 15%. If surface treated silica has an insufficient percent grafting, a silicone resin loaded therewith may be less transparent. The percent grafting may be controlled as appropriate by selecting the type of silica, the type and amount of organopolysiloxane of formula (1), and the like.

The silicone composition of the invention is characterized by loading of organopolysiloxane-grafted silica particles. The silicone composition may be of the addition or condensation cure type.

In a first preferred embodiment, the silicone composition of the addition cure type Is described as comprising as essential components, (A) an alkenyl group-containing organopolysiloxane, (B) an organohydrogenpolysiloxane, and (C) a platinum group metal based catalyst.

The organopolysiloxane (A) used herein is an organopolysiloxane having at least two silicon-bonded alkenyl groups in a molecule. It may be any of well-known organopolysiloxanes used as the base polymer in addition cure silicone compositions. Preferably the organopolysiloxane has a weight average molecular weight (Mw) of about 3,000 to about 300,000, as measured by gel permeation chromatography (GPC) versus polystyrene standards and a viscosity at room temperature (25° C.) of about 100 to about 1,000,000 mPa·s, more preferably about 200 to about 100,000 mPa·s, as measured by a rotational viscometer.

The organopolysiloxane is preferably of the average compositional formula (2):

$$R^3{}_a SiO_{(4-a)/2} \tag{2}$$

wherein $R^3$ is the same or different and selected from substituted or unsubstituted monovalent hydrocarbon groups of 1 to 10 carbon atoms, especially 1 to 8 carbon atoms, and the subscript "a" is a positive number from 1.5 to 2.8, preferably from 1.8 to 2.5, and more preferably 1.95 to 2.05.

Illustrative, non-limiting examples of silicon-bonded monovalent hydrocarbon groups represented by $R^3$ include alkyl groups such as methyl, ethyl, propyl, isopropyl, butyl, isobutyl, tert-butyl, pentyl, neopentyl, hexyl, cyclohexyl, octyl, nonyl and decyl; aryl groups such as phenyl, tolyl, xylyl and naphthyl; aralkyl groups such as benzyl, phenylethyl and phenylpropyl; alkenyl groups such as vinyl, allyl, propenyl, isopropenyl, butenyl, hexenyl, cyclohexenyl and octenyl; and substituted forms of the foregoing groups in which some or all hydrogen atoms are substituted by halogen atoms (e.g., fluoro, bromo, chloro), cyano groups or the like, such as chloromethyl, chloropropyl, bromoethyl, trifluoropropyl and cyanoethyl.

It is essential that at least two of $R^3$ be alkenyl groups, preferably of 2 to 8 carbon atoms, and more preferably of 2 to 6 carbon atoms. The content of alkenyl groups is preferably 0.01 to 20 mol %, and more preferably 0.1 to 10 mol % based on the entire silicon-bonded organic groups (i.e., substituted or unsubstituted monovalent hydrocarbon groups represented by $R^3$ in formula (2)). The alkenyl groups may be attached to silicon atoms at the ends and/or at intermediate positions of the molecular chain. It is preferred for the cure rate and cured physical properties of the composition that the organopolysiloxane used herein contain at least an alkenyl group attached to a silicon atom at the end of the molecular chain.

As to the structure, the organopolysiloxane is typically a diorganopolysiloxane of generally linear structure whose backbone consists of recurring diorganosiloxane units (($R^3$)$_2$ SiO$_{2/2}$ units) and whose molecular chain is capped at both ends with triorganosiloxy groups (($R^3$)$_3$SiO$_{1/2}$ units). It may also have a partially branched structure containing $R^3$SiO$_{3/2}$ units or SiO$_{4/2}$ units or a cyclic structure.

The substituent groups on silicon atoms may be any of the above listed groups although the preferred alkenyl group is vinyl and the preferred other substituent groups are methyl and phenyl.

Examples of organopolysiloxane (A) include compounds of the following general formulae.

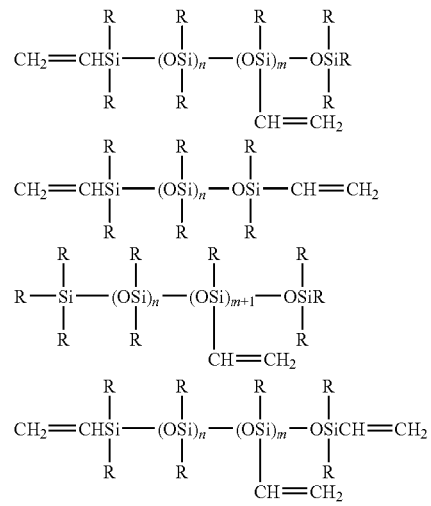

Herein, R is as defined for $R^3$, excluding alkenyl groups. The subscripts m and n are such integers of m≥1 and n≥0 that the organopolysiloxane may have a weight average molecular weight or viscosity within the above-specified range.

In the invention, an organopolysiloxane of resinous structure may be used in combination with the above organopolysiloxane. Note that the resinous structure is also referred to as three-dimensional network structure. Preferred are organopolysiloxanes of resinous structure consisting essentially of SiO$_2$ units, $R^4{}_k R^5{}_p SiO_{0.5}$ units and $R^4{}_q R^5{}_r SiO_{0.5}$ units wherein $R^4$ is vinyl or allyl, $R^5$ is a monovalent hydrocarbon group free of aliphatic unsaturation, k is 2 or 3, p is 0 or 1, k+p=3, q is 0 or 1, r is 2 or 3, and q+r=3. Suitable monovalent hydrocarbon groups represented by $R^5$ are those of 1 to 10 carbon atoms, preferably 1 to 6 carbon atoms, as exemplified above for $R^3$.

Preferably the organopolysiloxane of resinous structure consists essentially of SiO$_2$ units, $R^4{}_k R^5{}_p SiO_{0.5}$ units and $R^4{}_q R^5{}_r SiO_{0.5}$ units, which are simply represented by units a, b and c, respectively, in a molar ratio within the range:

(b+c)/a=0.3 to 3, especially 0.7 to 1 and c/a=0.01 to 1, especially 0.07 to 0.15.

Also preferably, the organopolysiloxane of resinous structure has a Mw of 500 to 10,000 as measured by GPC versus polystyrene standards.

The organopolysiloxane of resinous structure is compounded for the purpose of improving the physical strength and surface tack of the cured composition. It is preferably compounded in an amount of 20 to 70% by weight, and more preferably 30 to 60% by weight based on the weight of component (A). Outside the range, less amounts of the organopolysiloxane of resinous structure may fail to achieve the desired effect whereas larger amounts result in a composition which may be too viscous in the uncured state or prone to cracking in the cured state.

Component (B) is an organohydrogenpolysiloxane having at least two, preferably at least three hydrogen atoms each attached to a silicon atom (SiH groups) in a molecule. Component (B) serves as a crosslinking agent capable of reacting with component (A). The molecular structure of organohydrogenpolysiloxane is not particularly limited. Any of linear, cyclic, branched or three-dimensional network (or resinous) structures which are prepared in the art may be used as long as they have at least two silicon-bonded hydrogen atoms (SiH groups) in a molecule. Desirably the organohydrogenpolysiloxane has 2 to about 300, more preferably 3 to about 200, and even more preferably 4 to about 100 SiH groups. In the organohydrogenpolysiloxane used, the number of silicon atoms per molecule (or degree of polymerization) is generally 2 to 300, preferably 3 to 200, and more preferably 4 to 100.

Typically the organohydrogenpolysiloxane used herein has the average compositional formula (3):

$$R^6{}_b H_c SiO_{(4-b-c)/4} \qquad (3)$$

wherein $R^6$ is a substituted or unsubstituted monovalent hydrocarbon group of 1 to 10 carbon atoms. The monovalent hydrocarbon groups represented by $R^6$ are as exemplified for $R^3$ in formula (1) and preferably free of aliphatic unsaturation. The subscript b is a positive number of 0.7 to 2.1, c is a number of 0.001 to 1.0, and b+c is 0.8 to 3.0. Preferably, b ranges from 1.0 to 2.0, c ranges from 0.01 to 1.0, and b+c ranges from 1.5 to 2.5.

The at least two, preferably at least three SiH groups per molecule may be located at the ends or any intermediate positions of the molecular chain or both. The organohydrogenpolysiloxane may have a linear, cyclic, branched or three-dimensional network structure.

Examples of the organohydrogenpolysiloxane having formula (2) include, but are not limited to, 1,1,3,3-tetramethyldisiloxane, 1,3,5,7-tetramethylcyclotetrasiloxane, tris(hydrogendimethylsiloxy)methylsilane, tris(hydrogendimethylsiloxy)phenylsilane, methylhydrogencyclopolysiloxane, methylhydrogensiloxane-dimethylsiloxane cyclic copolymers, trimethylsiloxy-endcapped methylhydrogenpolysiloxane, trimethylsiloxy-endcapped dimethylsiloxane-methylhydrogensiloxane copolymers, dimethylhydrogensiloxy-endcapped dimethylpolysiloxane, dimethylhydrogensiloxy-endcapped dimethylsiloxane-methylhydrogensiloxane copolymers, trimethylsiloxy-endcapped methylhydrogensiloxane-diphenylsiloxane copolymers, trimethylsiloxy-endcapped methylhydrogensiloxane-diphenylsiloxane-dimethylsiloxane copolymers, trimethylsiloxy-endcapped methylhydrogensiloxane-methylphenylsiloxane-dimethylsiloxane copolymers, dimethylhydrogensiloxy-endcapped methylhydrogensiloxane-dimethylsiloxane-diphenylsiloxane copolymers, dimethylhydrogensiloxy-endcapped methylhydrogensiloxane-dimethylsiloxane-methylphenylsiloxane copolymers, copolymers of $(CH_3)_2HSiO_{1/2}$ units, $(CH_3)_3SiO_{1/2}$ units and $SiO_{4/2}$ units, copolymers of $(CH_3)_2HSiO_{1/2}$ units and $SiO_{4/2}$ units, and copolymers of $(CH_3)_2HSiO_{1/2}$ units, $SiO_{4/2}$ units and $(C_6H_5)SiO_{2/3}$ units. As used herein, the term "endcapped" means that the polysiloxane is capped at both ends of its molecular chain with the indicated groups.

Component (B) is added in such an amount as to give 0.1 to 5.0 equivalents, preferably 0.5 to 3.0 equivalents, and more preferably 0.8 to 2.0 equivalents of silicon-bonded hydrogen atoms per silicon-bonded alkenyl group in component (A). With less than 0.1 equivalent of silicon-bonded hydrogen atoms, the crosslinked density may be too low and the cured silicone may be less heat resistant. More than 5.0 equivalents of silicon-bonded hydrogen atoms may induce dehydrogenation reaction, giving rise to a problem of foaming and adversely affecting heat resistance.

Component (C) is a platinum group metal based catalyst that functions to promote addition reaction or hydrosilylation between components (A) and (B) for curing. Any well-known platinum group metal based catalysts may be used, with platinum and platinum compounds being preferred. Suitable platinum compounds include platinum black, platinic chloride, chloroplatinic acid, alcohol-modified chloroplatinic acid, and complexes of chloroplatinic acid with olefins, aldehydes, vinylsiloxanes or acetylene alcohols.

An amount of the platinum group metal based catalyst added may be determined in accordance with the desired cure rate. Generally, the catalyst may be used in such an amount to give 0.1 to 1,000 ppm, preferably 1 to 200 ppm of platinum group metal based on the weight of component (A).

In a second preferred embodiment, the silicone composition of the condensation cure type is described as comprising as essential components, (D) an organopolysiloxane capped with a hydroxyl or hydrolyzable group at an end of its molecular chain, (E) a silane having at least three silicon-bonded hydrolyzable groups in a molecule or a partial hydrolytic condensate thereof, and (F) a condensation catalyst.

Component (D) is an organopolysiloxane capped with a hydroxyl or hydrolyzable group at an end of its molecular chain, preferably having a viscosity at 25° C. of 100 to 500,000 mPa·s, more preferably 500 to 100,000 mPa·s. It may be any of well-known organopolysiloxanes used as the base polymer in condensation cure silicone compositions. Exemplary organopolysiloxanes capped with a hydroxyl or hydrolyzable group at a molecular chain end are α,ω-dihydroxy(or diorganoxy)-diorganopolysiloxanes having the general formulae (4), (5) and (6).

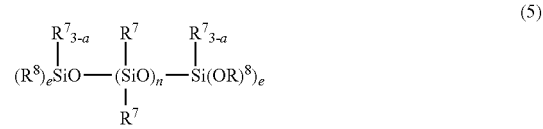

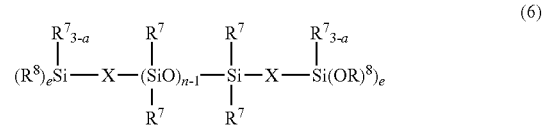

In these formulae, $R^7$ is the same or different and is a substituted or unsubstituted monovalent hydrocarbon group, d and n are such numbers that the corresponding diorganopolysiloxane may have a viscosity at 25° C. of 100 to 500,000 mPa·s, preferably 500 to 100,000 mPa·s, and e is 2 or 3.

X is an alkylene group of 2 to 6 carbon atoms, preferably 2 to 4 carbon atoms, such as ethylene, trimethylene, tetramethylene or methylethylene. $R^7$ is typically selected from monovalent hydrocarbon groups of 1 to 12 carbon atoms, preferably 1 to 10 carbon atoms, for example, alkyl groups such as methyl, ethyl, isopropyl, hexyl and octadecyl, alkenyl groups such as vinyl and hexenyl, cycloalkyl groups such as cyclohexyl and cyclopentyl, aralkyl groups such as benzyl and β-phenylethyl, aryl groups such as phenyl, xenyl, naphthyl, tolyl and xylyl, and substituted forms of the foregoing groups in which some or all hydrogen atoms are substituted by cyano groups or halogen atoms, such as β-cyanoethyl, 3,3,3-trifluoropropyl and perfluorobutyl. Most preferably $R^7$ is methyl.

$OR^8$ stands for a hydrolyzable group, examples of which include acyloxy groups such as acetoxy, octanoyloxy and benzoyloxy, ketoxime (or iminoxy) groups such as dimethylketoxime, methylethylketoxime and diethylketoxime, alkoxy groups such as methoxy, ethoxy and propoxy, alkoxyalkoxy groups such as methoxyethoxy, ethoxyethoxy and methoxypropoxy, alkenyloxy groups such as vinyloxy, isopropenyloxy and 1-ethyl-2-methylvinyloxy, amino groups such as dimethylamino, diethylamino, butylamino and cyclohexylamino, aminoxy groups such as dimethylaminoxy and diethylaminoxy, and amido groups such as N-methylacetamido, N-ethylacetamido and N-methylbenzamido.

Preferably, these hydrolyzable groups are positioned at both ends of the molecular chain of linear diorganopolysiloxane, while taking the form of two or three hydrolyzable group-containing siloxy groups or two or three hydrolyzable group-containing siloxyalkyl groups, for example, trialkoxysiloxy, dialkoxyorganosiloxy, triacyloxysiloxy, diacyloxyorganosiloxy, triiminoxysiloxy (i.e., triketoximesiloxy), diiminoxyorganosiloxy, trialkenoxysiloxy, dialkenoxyorganosiloxy, trialkoxysiloxyethyl, and dialkoxyorganosiloxyethyl.

Preferably $OR^8$ is an alkoxy group, and $R^8$ is a chainlike alkyl group such as methyl, ethyl, isopropyl, hexyl or octadecyl, with methyl and ethyl being preferred.

$R^7$ may be the same or a mixture of different groups and $OR^8$ may be the same or a mixture of different groups. For ease of synthesis and a balance of the viscosity of uncured composition and the mechanical properties of cured composition, it is preferred that at least 90 mol % or all of $R^7$ be methyl, and if groups other than methyl are contained, they are vinyl or phenyl.

Examples of the organopolysiloxane include, but are not limited to, silanol-endcapped dimethylpolysiloxane, silanol-endcapped dimethylsiloxane-methylphenylsiloxane copolymers, silanol-endcapped dimethylsiloxane-diphenylsiloxane copolymers, trimethoxysiloxy-endcapped dimethylpolysiloxane, trimethoxysiloxy-endcapped dimethylsiloxane-methylphenylsiloxane copolymers, trimethoxysiloxy-endcapped dimethylsiloxane-diphenylsiloxane copolymers, methyldimethoxysiloxy-endcapped dimethylpolysiloxane, triethoxysiloxy-endcapped dimethylpolysiloxane, and 2-trimeathoxysiloxyethyl-endcapped dimethylpolysiloxane. They may be used alone or in a combination of two or more.

Component (E) is a silane having at least three silicon-bonded hydrolyzable groups in a molecule or a partial hydrolytic condensate thereof (i.e., organopolysiloxane having at least one, preferably at least two hydrolyzable groups left). It serves as a curing agent. Compounding of component (E) in the composition may be omitted when the base polymer has at least two silicon-bonded hydrolyzable groups other than silanol groups in a molecule.

The silane used herein typically has the formula:

wherein $R^9$ is a substituted or unsubstituted monovalent hydrocarbon group of 1 to 10 carbon atoms, preferably 1 to 8 carbon atoms, Y is a hydrolyzable group, and f is 0 or 1. Exemplary groups of $R^9$ are alkyl groups such as methyl and ethyl, alkenyl groups such as vinyl, allyl and propenyl, and aryl groups such as phenyl. The hydrolyzable group of Y may be the same as illustrated for the silicon-bonded hydrolyzable group ($OR^8$) in component (D), for example, alkoxy, alkenoxy, ketoxime, acetoxy, amino and aminoxy groups.

Examples of the silane or partial hydrolytic condensate thereof include methyltriethoxysilane, vinyltriethoxysilane, vinyltriacetoxysilane, ethyl orthosilicate, and partial hydrolytic condensates thereof. They may be used alone or in a combination of two or more.

In the composition of the second embodiment, the silane or partial hydrolytic condensate thereof may preferably be compounded in an amount of 0.01 to 20 parts by weight, and more preferably 0.1 to 10 parts by weight per 100 parts by weight of component (D). Outside the range, compositions containing less amounts of the silane tend to be less shelf stable or less adherent whereas compositions containing larger amounts of the silane tend to be considerably slow in curing.

Component (E) as the curing or crosslinking agent is essential when component (D) is an organopolysiloxane capped with a hydroxyl group at an end of the molecular chain as represented by formula (4). It is not essential when component (D) is an organopolysiloxane capped with a hydrolyzable group at an end of the molecular chain as represented by formula (5) or (6). That is, component (E) is optional in the latter case.

Component (F) is a condensation catalyst. The catalyst is optional in that it may be omitted when the silane or partial hydrolytic condensate thereof has an aminoxy, amino, or ketoxime group, for example. Examples of the condensation catalyst include organic titanates such as tetrabutyl titanate and tetraisopropyl titanate; organic titanium chelate compounds such as titanium diisopropoxybis(ethylacetoacetate) and titanium diisopropoxybis(ethylacetoacetate); organoaluminum compounds such as tris(acetylacetonato)aluminum and tris(ethylacetoacetato)aluminum; organozirconium compounds such as tetra(acetylacetonato)zirconium and zirconium tetrabutyrate; organotin compounds such as dibutyl tin dioctoate, dibutyl tin dilaurate and dibutyl tin di(2-ethylhexanoate); metal salts of organic carboxylic acids such as tin naphthenate, tin oleate, tin butyrate, cobalt naphthenate, and zinc stearate; amine compounds such as hexylamine and dodecylamine phosphate; quaternary ammonium salts such as benzyltriethylammonium acetate; alkali metal salts of lower fatty acids such as potassium acetate and lithium nitrate; dialkylhydroxylamines such as dimethylhydroxylamine and diethylhydroxylamine; guanidyl-containing organosilicon compounds. They may be used alone or in a combination of two or more.

In the composition, when the condensation catalyst (F) is used, its amount is not particularly limited and may be a catalytic amount. Specifically, the condensation catalyst is preferably compounded in an amount of 0.01 to 20 parts, and more preferably 0.1 to 10 parts by weight per 100 parts by weight of component (E). If the amount of the catalyst used is below the range, some compositions may not fully cure depending on the type of crosslinking agent. If the amount of the catalyst used is above the range, some compositions may be less shelf stable.

According to the invention, the addition or condensation cure type silicone composition as described above is loaded with silica particles having the organopolysiloxane of formula (1) grafted to surfaces thereof. Specifically, silica particles having the organopolysiloxane grafted thereto are compounded in an amount of 5 to 400 parts, more preferably 50 to 250 parts, and even more preferably 100 to 200 parts by weight per 100 parts by weight of the total of silane and siloxane components in the composition (i.e., the total of components (A) and (B) or the total of components (D) and (E)). This range ensures that silicone compositions cure into products having high transparency, minimal expansion and low gas permeability.

The silicone composition in which silica particles in the form of silica particles of nano size having an organopolysiloxane grafted to surfaces thereof are uniformly dispersed is advantageous in that when a phosphor such as yttrium aluminum garnet (YAG) is incorporated in the silicone composition, the silicone composition prevents the phosphor from settling upon curing. The addition of nano-size silica to prevent such settling is known from JP-A 2005-524737. This technique, however, increases thixotropy and reduces working efficiency.

In the inventive silicone composition, a symptom of thixotropy is not observed even though a large amount of grafted silica of nano size is added or compounded to the composition. The silicone composition of the invention is characterized by a loss of thixotropy, a good flow, and inhibition of phosphor settling.

To impart adhesion to the inventive composition, a tackifier may be optionally added to the composition. Suitable tackifiers include linear or cyclic organosiloxane oligomers of about 4 to 50 silicon atoms, preferably about 4 to 20 silicon atoms, having per molecule at least two, preferably two or three functional groups selected from among silicon-bonded hydrogen atoms (i.e., SiH), silicon-bonded alkenyl groups (e.g., Si—CH=CH$_2$), alkoxysilyl groups (e.g., trimethoxysilyl) and epoxy groups (e.g., glycidoxypropyl, 3,4-epoxycyclohexylethyl), and organoxysilyl-modified isocyanurate compounds having the general formula (7) and/or hydrolytic condensates thereof (organosiloxane-modified isocyanurate compounds).

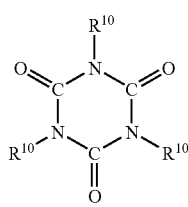

(7)

Herein $R^{10}$ is an organic group of formula (8):

(8)

or a monovalent hydrocarbon group with aliphatic unsaturation, at least one of $R^{10}$ is an organic group of formula (8), $R^{11}$ is hydrogen or a monovalent hydrocarbon group of 1 to 6 carbon atoms, and s is an integer of 1 to 6, especially 1 to 4.

Examples of the monovalent hydrocarbon group with aliphatic unsaturation represented by $R^{10}$ include alkenyl groups of 2 to 8 carbon atoms, especially 2 to 6 carbon atoms, such as vinyl, allyl, propenyl, isopropenyl, butenyl, isobutenyl, pentenyl, hexenyl and cyclohexenyl. Suitable monovalent hydrocarbon groups represented by $R^{11}$ are those of 1 to 8 carbon atoms, especially 1 to 6 carbon atoms, including alkyl groups such as methyl, ethyl, propyl, isopropyl, butyl, isobutyl, tert-butyl, pentyl, hexyl, and cyclohexyl, alkenyl groups as exemplified above for $R^{10}$, such as vinyl, allyl, propenyl and isopropenyl, and aryl groups such as phenyl. Inter alia, alkyl groups are preferable.

Illustrative, non-limiting examples of the tackifier are shown below.

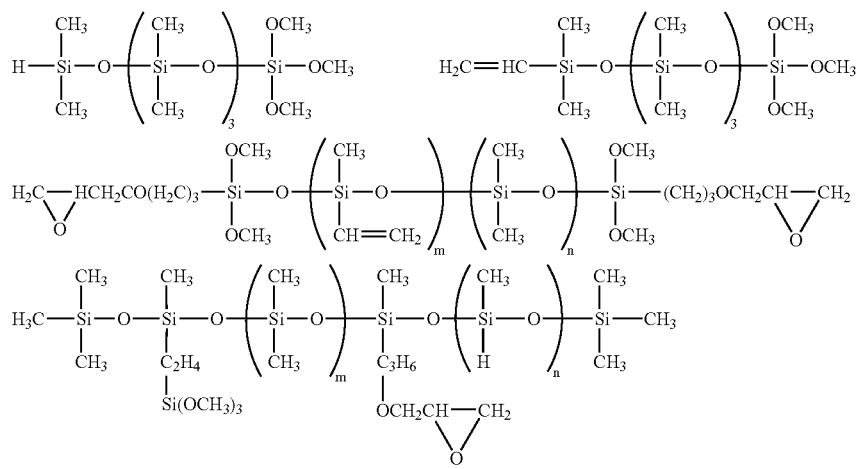

Herein, m and n are positive integers satisfying that m+n is 2 to 50, preferably 4 to 20.

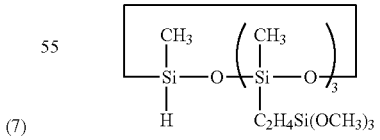

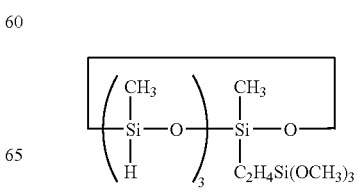

-continued

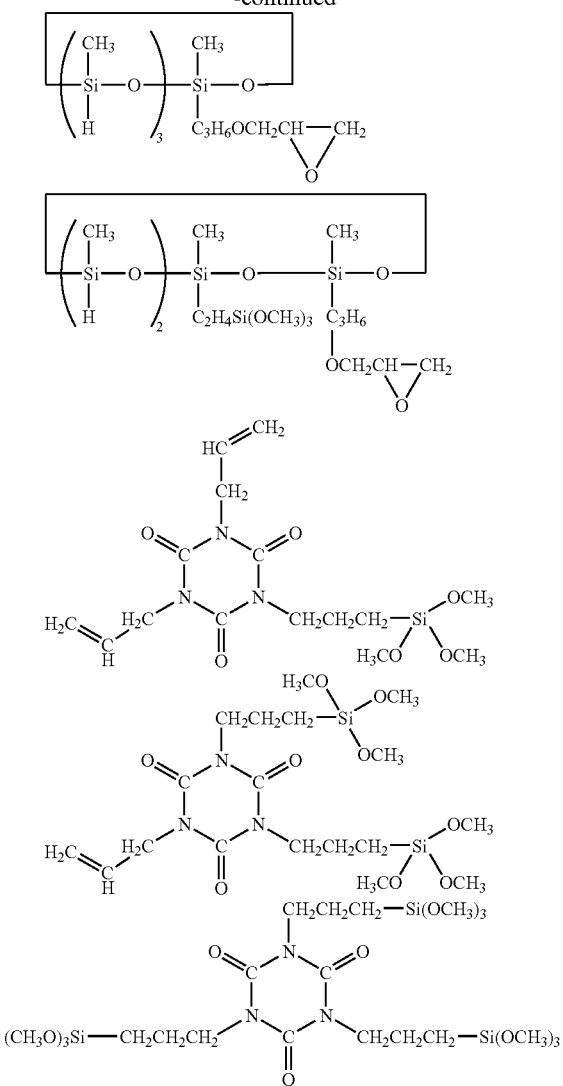

Of the organosilicon compounds, those organosilicon compounds having a silicon-bonded alkoxy group and an alkenyl group or silicon-bonded hydrogen atom (SiH group) in a molecule are preferred because of better adhesion of the cured composition.

In the composition, the tackifier is typically compounded in an amount of up to 10 parts (i.e., 0 to 10 parts), preferably 0.01 to 5 parts, and more preferably 0.1 to 1 part by weight per 100 parts by weight of the total of base polymer and curing agent, though optional. Some compositions with too less amounts of the tackifier may be less adherent to the substrate whereas too much amounts of the tackifier may adversely affect the hardness and surface tack of the cured composition.

The silicone composition of the invention is prepared by mixing silica particles having the organopolysiloxane grafted to surfaces thereof with other components on a planetary mixer or three-roll mill until uniform. The addition cure type silicone composition may be prepared as a one-part composition as long as an amount of a cure inhibitor such as acetylene alcohol is added.

The silicone compositions of the invention cures into products which are highly light transmissive despite heavy loading of silica particles, specifically has a light transmittance of at least 80% (80 to 100%), more specifically at least 90% (90 to 100%), and even more specifically at least 95% (95 to 100%), in a wavelength region of 400 to 800 nm.

The silicone compositions of the invention are suited for the encapsulation of optoelectronic devices, specifically LEDs, more specifically blue, white and UV LEDs. In conjunction with blue LED, various well-known powdered phosphors may be added to the composition for converting the emission to white. Typical yellow phosphors are particulate phosphors of the garnet group having the formula: $A_3B_5O_{12}$:M wherein A is at least one element selected from the group consisting of Y, Gd, Tb, La, Lu, Se and Sm, B is at least one element selected from the group consisting of Al, Ga and In, and M is at least one element selected from the group consisting of Ce, Pr, Eu, Cr, Nd and Er. For a white light-emitting diode device including a blue light-emitting diode chip, suitable phosphors are $Y_3Al_5O_{12}$:Ce and $(Y,Gd,Tb)_3(Al,Ga)_5O_{12}$:Ce phosphors. Other suitable phosphors include $CaGa_2S_4$:$Ce^{3+}$, $SrGa_2S_4$:$Ce^{3+}$, $YAlO_3$:$Ce^{3+}$, $YGaO_3$:$Ce^{3+}$, $Y(Al,Ga)O_3$:$Ce^{3+}$, and $Y_2SiO_5$:$Ce^{3+}$. Besides these phosphors, rare earth-doped aluminates and orthosilicates are also suitable to produce mixed color light. Depending on the thickness of a particular layer formed of the composition, the phosphor is incorporated in an amount of 0.5 to 200 parts by weight per 100 parts by weight of the total of silane and siloxane components in the composition (i.e., the total of components (A) and (B) or the total of components (D) and (E)). The composition is thus endowed with an ability to convert blue light to white light. Although most phosphors have so high a specific gravity that they tend to settle down in the course of the silicone composition curing and are quite difficult to facilitate uniform dispersion, the inventive composition obviates troubles of this type.

Most often, the inventive composition is used for the encapsulation of optoelectronic semiconductor devices such as LEDs. In a typical process, the composition is applied to an LED chip mounted on a premolded package and cured to form a cured product on the LED chip, thereby encapsulating the LED chip with the cured composition. Alternatively, the composition may be dissolved in an organic solvent such as toluene or xylene to form a varnish, which is applied to an LED chip.

Because of its excellent properties including heat resistance, UV resistance and transparency, the inventive composition may find use in various other applications, for example, display materials, optical recording media materials, optical equipment materials, optical component materials, optical fiber materials, optoelectronic functional organic materials, and semiconductor IC peripheral materials.

(1) Display Materials

Suitable display materials include those associated with liquid crystal displays and peripheral components, such as substrate materials, light-guides, prism sheets, polarizers, retardation films, viewing angle compensating films, adhesives, and polarizer protective films; those associated with color plasma display panels (PDP) which are next generation flat panel displays, such as sealants, antireflection films, optical compensating films, housing materials, front glass protective films, front glass substitutes, and adhesives; those associated with plasma address liquid crystal (PALC) displays such as substrate materials, light-guides, prism sheets, polarizers, retardation films, viewing angle compensating films, adhesives, and polarizer protective films; those associated with organic electroluminescent (EL) displays such as front glass protective films, front glass substitutes, and adhesives; those associated with field emission displays (FED) such as film substrates, front glass protective films, front glass substitutes, and adhesives.

(2) Optical Recording Materials

Suitable optical recording materials include disc substrate materials, pickup lenses, protective films, sealants and adhesives for VD (video discs), CD, CD-ROM, CD-R/CD-RW, DVD±R/DVD±RW/DVD-RAM, MO, MD, PD (phase change disc), and optical cards.

(3) Optical Equipment Materials

Suitable optical equipment materials include those for still cameras such as lens materials, finder prisms, target prisms, finder covers, and photo-sensors; those for video cameras such as imaging lenses and finders; those for projection televisions such as projection lenses, protective films, sealants, and adhesives; those for optical sensing equipment such as lens materials, sealants, adhesives and films.

(4) Optical Component Materials

Suitable optical component materials include those for optical communication systems, for example, fiber materials, lenses, waveguides, sealants and adhesives for use in optical switches; optical fiber materials, ferrules, sealants and adhesives for use in optical connectors; lenses, waveguides and adhesives for use in photo-receptor components and optical circuit components; substrate materials, fiber material, sealants and adhesives for use in optoelectronic integrated circuits (OEIC).

(5) Optical Fiber Materials

Suitable optical fiber materials include illumination and light-guides for decoration displays; sensors, indicators and signs for industrial use; optical fibers for digital equipment connection in communication infrastructures and household systems.

(6) Semiconductor IC Peripheral Materials

Suitable semiconductor IC peripheral materials include resist materials for use in the micro-lithography of LSI and VLSI materials.

(7) Optoelectronic Organic Materials

Suitable optoelectronic organic materials include peripheral materials for organic EL devices; organic photorefractive devices; substrate materials for optical amplifiers (which are photo-photo converters), optical computing devices, and organic solar cells; fiber materials; and sealants and adhesives for the foregoing devices.

EXAMPLE

Examples of the invention are given below by way of illustration and not by way of limitation. All parts are by weight (abbreviated as pbw). Me stands for methyl, and Et stands for ethyl.

Synthesis Example 1

Grafting to Nano-Size Silica

A flask equipped with a reflux condenser was charged with 50 parts of Aerosil 200 (average particle size 12 nm, Nippon Aerosil Co., Ltd.), 25 parts of polysiloxane (1) of the structure shown below (Shin-Etsu Chemical Co., Ltd.), and 500 parts of xylene. Grafting reaction was effected by heating under reflux at 150° C. for 24 hours. After the completion of reaction, the grafted silica was separated from xylene and unreacted polysiloxane using a centrifuge. Then 500 parts of xylene was added to the silica, followed by agitation and centrifugation. This workup was repeated twice, removing the unreacted polysiloxane. The silica thus separated was dried at 120° C. for 4 hours, yielding grafted silica 1. Silica 1 was analyzed for percent grafting by TGA, finding a grafting value of 8.7%. The percent grafting was also confirmed by FT-IR analysis.

Five grafted silicas 2 to 6 were similarly prepared by effecting grafting reaction of silica and polysiloxane in varying mixing ratios as shown in Table 1.

TABLE 1

| Grafted silica | Silica 2 | Silica 3 | Silica 4 | Silica 5 | Silica 6 |
|---|---|---|---|---|---|
| Aerosil 200 (pbw) | 50 | 50 | 50 |  | 50 |
| Aerosil 300* (pbw) |  |  |  | 50 |  |
| Polysiloxane (1) (pbw) | 10 |  | 3 |  |  |
| Polysiloxane (2) (pbw) |  | 20 |  | 20 |  |
| Polysiloxane (3) (pbw) |  |  |  |  | 20 |
| Xylena (pbw) | 250 | 400 | 250 | 400 | 250 |
| Grafting (wt %) | 9.0 | 8.5 | 3.1 | 9.1 | 9.2 |

* average particle size~7 nm

Polysiloxane (1)

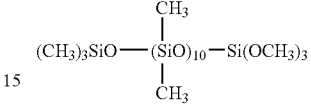

Polysiloxane (2)

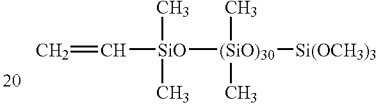

Polysiloxane (3)

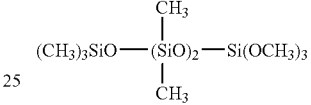

Examples 1 to 4 and Comparative Examples 1 to 2

To 75 parts of vinyldimethylsiloxy-endcapped dimethylpolysiloxane having the formula (i):

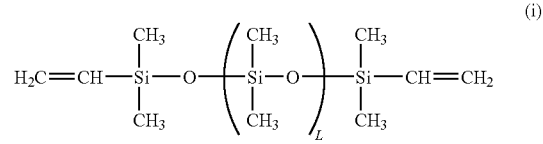

wherein L=450, were added 25 parts of vinylmethylsiloxane (VMQ) of resinous structure consisting of 50 mol % $SiO_2$ units, 42.5 mol % $(CH_3)_3SiO_{0.5}$ units and 7.5 mol % $(CH_2\!=\!CH)(CH_3)_2SiO_{0.5}$ units, 5.3 parts of organohydrogenpolysiloxane having the formula (ii):

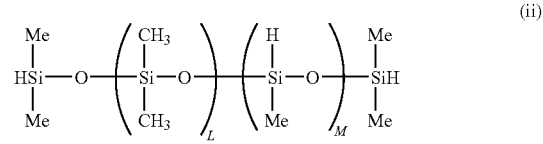

wherein L=10 and M=8 (corresponding to 1.5 moles of SiH groups per mole of vinyl groups in the vinyl-containing dimethylpolysiloxanes (i) and (ii)), and 0.05 part of an octyl alcohol modified solution of chloroplatinic acid (Pt concentration 1 wt %). Thorough agitation gave a silicone compound. This silicone compound, 100 parts, was combined with 100 parts of silicas 1 to 6 prepared in Synthesis Example 1. They were mixed on a planetary mixer, yielding liquid silicone compositions #1 to #6. Notably, silicone composition #5 became powdered during mixing and was no longer evaluated.

Silicone compositions #1 to #4 and #6 were cured by heating at 150° C. for 4 hours. The cured compositions were measured for physical properties according to JIS K-6301. Hardness is measured by a Type A spring tester. The results are shown in Table 2.

A test sample was prepared by placing a silver-plated copper substrate on a glass support, applying each composition on the substrate to a thickness of 0.3 mm and curing the coating at 70° C. for 1 hour. The test sample was placed in a container of 2 liter volume, which was fed with 20 g of $(NH_4)_2S$ and 10 g of $H_2O$. With the container closed, the sample was held in the $H_2S$ gas atmosphere at 23° C. for the time shown in Table 2. The sample was taken out and inspected for corrosion on the silver-plated copper substrate. The sample was rated "○" for no corrosion, "Δ" for partially discolored, and "×" for blackened (complete corrosion). The results are shown in Table 2.

The silicone compositions were cured at 150° C. for 4 hours into films of 1 mm thick, which were measured for light transmittance in the wavelength region of 400 to 800 nm. They were also measured for moisture permeability according to JIS Z-0208. The results are also shown in Table 2.

Example 7

A silicone compound was prepared by adding 0.1 part of a titanium chelate catalyst (trade name TC-750 by Matsumoto Fine Chemical Co., Ltd.) to 100 parts of trimethoxysiloxy-endcapped dimethylpolysiloxane having the formula (iii):

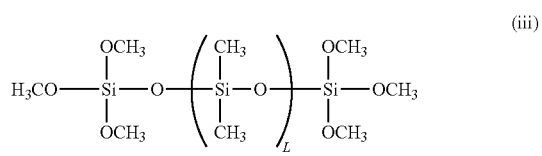

(iii)

wherein L=450, followed by thorough agitation. This silicone compound, 100 parts, was combined with 50 parts of silica 1

TABLE 2

|  | Example | | | | Comparative Example | |
| --- | --- | --- | --- | --- | --- | --- |
|  | 1 Composition #1 | 2 Composition #2 | 3 Composition #3 | 4 Composition #4 | 1 Composition #5 | 2 Composition #6 |
| Grafted silica | Silica 1 | Silica 2 | Silica 3 | Silica 5 | Silica 4 | Silica 6 |
| Hardness (Type A) | 95 | 93 | 94 | 90 | UM | 97 |
| Elongation, % | 80 | 82 | 85 | 81 | UM | 78 |
| Tensile strength, MPa | 5 | 5 | 4 | 5 | UM | 4 |
| Corrosion test   0 hr | ○ | ○ | ○ | ○ | UM | ○ |
| 2 hr | ○ | ○ | ○ | ○ |  | ○ |
| 4 hr | ○ | ○ | ○ | ○ |  | Δ |
| Light transmittance, % | 97 | 95 | 94 | 95 | UM | 55 |
| Moisture permeability, g/m²-24 hr | 40 | 40 | 41 | 40 | UM | 60 |

UM: unmeasurable

Examples 5 to 6 and Comparative Examples 3 to 5

Liquid silicone compositions #7 to #11 were prepared as in Example 1 except that the amount of silica 1 (in Synthesis Example 1) was changed from 100 parts to 25, 150, 500, 0, and 3 parts. Notably, silicone composition #9 became paste with a high viscosity and difficult to work, so test specimens suitable for physical tests could not be prepared. The silicone compositions excluding #9 were cured by heating at 80° C. for 4 hours.

As in Example 1, the cured compositions were tested for physical properties, corrosion and light transmittance. The results are shown in Table 3.

(prepared in Synthesis Example 1). They were mixed to yield a liquid silicone composition #12.

The silicone composition was allowed to cure at 23° C. and 50% RH for 24 hours, before it was tested for physical properties, corrosion and light transmittance as in Example 1. The cured composition had a Type A hardness of 68, an elongation of 95%, and a tensile strength of 5 MPa. In the corrosion test, little corrosion was observed even after 8 hours. The light transmittance in the visible range was as high as 96%.

Example 8 and Comparative Example 6

A composition was prepared by mixing 100 parts of silicone composition #1 with 10 parts of YAG yellow phosphor

TABLE 3

|  | Example | | Comparative Example | | |
| --- | --- | --- | --- | --- | --- |
|  | 5 Composition #7 | 6 Composition #8 | 3 Composition #9 | 4 Composition #10 | 5 Composition #11 |
| Amount of silica 1, pbw | 25 | 150 | 500 | 0 | 3 |
| Hardness (Type A) | 65 | 96 | UM | 50 | 53 |
| Elongation, % | 85 | 80 | UM | 95 | 92 |
| Tensile strength, MPa | 5 | 5 | UM | 3 | 3 |
| Corrosion test   0 hr | ○ | ○ | UM | ○ | ○ |
| 1.0 hr | ○ | ○ | — | X | X |
| 2.0 hr | ○ | ○ | — | X | X |
| Light transmittance, % | 97 | 95 | UM | 98 | 97 |

UM: unmeasurable powder. Another composition was prepared by mixing 100 parts of silicone composition #10 with 10 parts of the phosphor.

Each composition was admitted into a square package of 2 mm thick and 3 mm sides molded from thermoplastic resin, and cured stepwise at 60° C. for 1 hour and at 150° C. for 2 hours.

After curing, the package was cut, and the section was observed to see how the phosphor settled down. In Example 8 (phosphor-loaded silicone composition #1), no settling of the phosphor was observed. In Comparative Example 6 (phosphor-loaded silicone composition #10), settling of the phosphor was observed.

Examples 9 to 14 and Comparative Examples 7 to 9

There was furnished an LED-mounting premolded package of 1 mm thick and 3 mm sides having an open recess with a diameter of 2.6 mm and a silver-plated bottom. Using silver paste, an InGaN based blue light-emitting diode chip was secured to the package. Using gold wire, external electrodes were connected to the LED chip. Each of the silicone compositions of Examples and Comparative Examples was cast into the open recess of the package where it was cured at 60° C. for 1 hour and at 150° C. for 2 hours, completing an LED package.

The package thus fabricated was examined by a thermal cycling test and measured for initial luminance. The package was submitted to 1,000 cycles of a thermal cycling test consisting of −40° C./30 minutes and 125° C./30 minutes. The package was rated "defect-free" when no delamination was observed. Emission was produced by conducting a current flow of 10 mA across the LED, and the luminance measured by a measuring system LP-3400 (Otsuka Electronics Co., Ltd.). The package was rated "High" for a luminance of at least 15 milli-lumen (mlm) and "Low" for a luminance of less than 15 mlm.

admitting 100 parts by weight of silica particles and 10 to 50 parts by weight of the organopolysiloxane in a solvent and heating the mixture under reflux at a temperature of 50 to 200° C. for 1 to 50 hours, said organopolysiloxane having the general formula (1a):

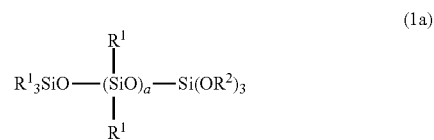

wherein $R^1$ is each independently a substituted or unsubstituted monovalent hydrocarbon group of 1 to 10 carbon atoms but not an alkoxy group, $R^2$ is methyl or ethyl, a is an integer of 3 to 50.

2. The silicone composition of claim 1 which in the cured state, has a light transmittance of at least 80% in a wavelength region of 400 to 800 nm.

3. A highly transparent silicone composition, which is addition or condensation curable, comprising
(A) an alkenyl group-containing organopolysiloxane,
(B) an organohydrogenpolysiloxane in an amount as to give 0.1 to 5.0 equivalents of silicon-bonded hydrogen atoms per silicon-bonded alkenyl group in component (A),
(C) a platinum group metal based catalyst in an amount to give 0.1 to 1,000 ppm of platinum group metal based on the weight of component (A), and
silica particles having an organopolysiloxane of the general formula (1a) grafted to surfaces thereof by previously admitting 100 parts by weight of silica particles and 10 to 50 parts by weight of the organopolysiloxane in a solvent and heating the mixture under reflux at a temperature of 50 to 200° C. for 1 to 50 hours in an

TABLE 4

|  | Example | | | | | | Comparative Example | | |
| --- | --- | --- | --- | --- | --- | --- | --- | --- | --- |
|  | 9 | 10 | 11 | 12 | 13 | 14 | 7 | 8 | 9 |
| Silicone composition | #1 | #2 | #4 | #7 | #8 | #12 | #5 | #6 | #10 |
| 1000 thermal cycles (−40°-125° C.) | defect-free | defect-free | defect-free | defect-free | defect-free | defect-free | UM* | defect-free | Delaminated at interface |
| Initial luminance | High | High | High | High | High | High | UM* | Low | High |

*UM (unmeasurable) means that the silicone composition became powdered and could not be cast into a package.

Japanese Patent Application No. 2007-295295 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A highly transparent silicone composition, which is addition or condensation curable, comprising
100 parts by weight of a total of silane or siloxane components, and
5 to 400 parts by weight of silica particles having an organopolysiloxane grafted to surfaces thereof by previously amount of 5 to 400 parts by weight per 100 parts by weight of the total of components (A) and (B):

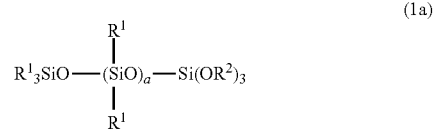

wherein $R^1$ is each independently a substituted or unsubstituted monovalent hydrocarbon group of 1 to 10 carbon atoms but not alkoxy group, $R^2$ is methyl or ethyl, a is an integer of 3 to 50.

4. A highly transparent silicone composition, which is addition or condensation curable, comprising
(D) an organopolysiloxane capped with a hydroxyl or hydrolyzable group at an end of its molecular chain,
(E) a silane having at least three silicon-bonded hydrolyzable groups in a molecule or a partial hydrolytic condensate thereof in an amount of 0.01 to 20 parts by weight per 100 parts by weight of component (D),
(F) a condensation catalyst in an amount of 0.01 to 20 parts by weight of component (E), and
silica particles having an organopolysiloxane of the general formula (1a) grafted to surfaces thereof by previously admitting 100 parts by weight of silica particles and 10 to 50 parts by weight of the organopolysiloxane in a solvent and heating the mixture under reflux at a temperature of 50 to 200° C. for 1 to 50 hours in an amount of 5 to 400 parts by weight per 100 parts by weight of the total of components (D) and (E):

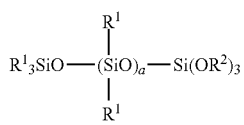

(1a)

wherein $R^1$ is each independently a substituted or unsubstituted monovalent hydrocarbon group of 1 to 10 carbon atoms but not an alkoxy group, $R^2$ is methyl or ethyl, a is an integer of 3 to 50.

5. The silicone composition of claim 1, further comprising a phosphor.

6. An optoelectronic device encapsulated with a highly transparent silicone composition, which is addition or condensation curable, comprising
100 parts by weight of a total of silane or siloxane components, and
5 to 400 parts by weight of silica particles having an organopolysiloxane grafted to surfaces thereof by previously admitting 100 parts by weight of silica particles and 10 to 50 parts by weight of the organopolysiloxane in a solvent and heating the mixture under reflux at a temperature of 50 to 200° C. for 1 to 50 hours, said organopolysiloxane having the general formula (1a):

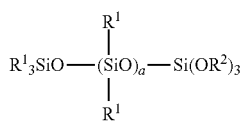

(1a)

wherein $R^1$ is each independently a substituted or unsubstituted monovalent hydrocarbon group of 1 to 10 carbon atoms but not alkoxy group, $R^2$ is methyl or ethyl, a is an integer of 3 to 50 in the cured state.

7. The silicone composition of claim 1, wherein a percent grafting of the grafted silica particles is 4 to 30%, and an average particle size of silica particles is 1 nm to less than 1,000 nm.

8. The silicone composition of claim 3, wherein the organopolysiloxane of formula (1a) is a vinyl-containing organopolysiloxane for grafting.

9. The silicone composition of claim 3, wherein a percent grafting of the grafted silica particles is 4 to 30% and an average particle size of silica particles is 1 nm to less than 1,000 nm.

10. The silicone composition of claim 3, further comprising a phosphor.

11. An optoelectronic device encapsulated with a highly transparent silicone composition, which is addition curable, comprising
(A) an alkenyl group-containing organopolysiloxane,
(B) an organohydrogenpolysiloxane in an amount as to give 0.1 to 5.0 equivalents of silicon-bonded hydrogen atoms per silicon-bonded alkenyl group in component (A),
(C) a platinum group metal based catalyst in an amount to give 0.1 to 1,000 ppm of platinum group metal based on the weight of component (A), and
silica particles having an organopolysiloxane of the general formula (1a) grafted to surfaces thereof by previously admitting 100 parts by weight of silica particles and 10 to 50 parts by weight of the organopolysiloxane in a solvent and heating the mixture under reflux at a temperature of 50 to 200° C. for 1 to 50 hours in an amount of 5 to 400 parts by weight per 100 parts by weight of the total of components (A) and (B):

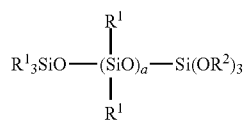

(1a)

wherein $R^1$ is each independently a substituted or unsubstituted monovalent hydrocarbon group of 1 to 10 carbon atoms but not an alkoxy group, $R^2$ is methyl or ethyl, a is an integer of 3 to 50 in the cured state.

12. The silicone composition of claim 4, wherein a percent grafting of the grafted silica particles is 4 to 30% and an average particle size of silica particles is 1 nm to less than 1,000 nm.

13. The silicone composition of claim 4, further comprising a phosphor.

14. An optoelectronic device encapsulated with a highly transparent silicone composition, which is condensation curable, comprising
(D) an organopolysiloxane capped with a hydroxyl or hydrolyzable group at an end of its molecular chain,
(E) a silane having at least three silicon-bonded hydrolyzable groups in a molecule or a partial hydrolytic condensate thereof in an amount of 0.01 to 20 parts by weight per 100 parts by weight of component (D),
(F) a condensation catalyst in an amount of 0.01 to 20 parts by weight of component (E), and
silica particles having an organopolysiloxane of the general formula (1a) grafted to surfaces thereof by previously admitting 100 parts by weight of silica particles and 10 to 50 parts by weight of the organopolysiloxane in a solvent and heating the mixture under reflux at a temperature of 50 to 200° C. for 1 to 50 hours in an amount of 5 to 400 parts by weight per 100 parts by weight of the total of components (D) and (E):

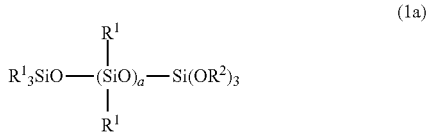
(1a)

wherein $R^1$ is each independently a substituted or unsubstituted monovalent hydrocarbon group of 1 to 10 carbon atoms but not alkoxy group, $R^2$ is methyl or ethyl, a is an integer of 3 to 50 in the cured state.

15. A highly transparent silicone composition, which is addition curable comprising
(A) an alkenyl group-containing organopolysiloxane selected from the following:

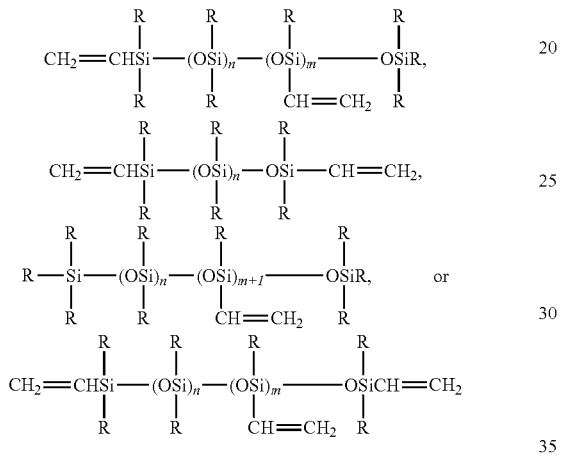

wherein R is the same or different and selected from substituted or unsubstituted monovalent hydrocarbon groups of 1 to 10 carbon atoms excluding alkenyl groups, the subscripts m and n are such integers of m≥1 and n≥0 that the organopolysiloxane has a weight average molecular weight of about 3,000 to about 300,000,
(B) an organohydrogenpolysiloxane in an amount as to give 0.1 to 5.0 equivalents of silicon-bonded hydrogen atoms per silicon-bonded alkenyl group in component (A),
(C) a platinum group metal based catalyst in an amount to give 0.1 to 1,000 ppm of platinum group metal based on the weight of component (A), and
silica particles having an organopolysiloxane of the general formula (1) grafted to surfaces thereof by previously admitting 100 parts by weight of silica particles and 10 to 50 parts by weight of the organopolysiloxane in a solvent and heating the mixture under reflux at a temperature of 50 to 200° C. for 1 to 50 hours in an amount of 5 to 400 parts by weight per 100 parts by weight of the total of components (A) and (B):

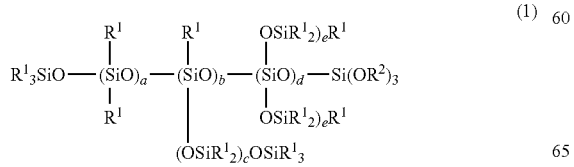
(1)

wherein $R^1$ is each independently a substituted or unsubstituted monovalent hydrocarbon group of 1 to 10 carbon atoms but not an alkoxy group, $R^2$ is methyl or ethyl, a is an integer of 1 to 50, b is 0 or 1, d is 0 or 1, c and e each are an integer of 0 to 10, and the sum of a+b+d is an integer of 3 to 52.

16. A highly transparent silicone composition, which is addition curable, comprising
(A) an alkenyl group-containing organopolysiloxane selected from the following:

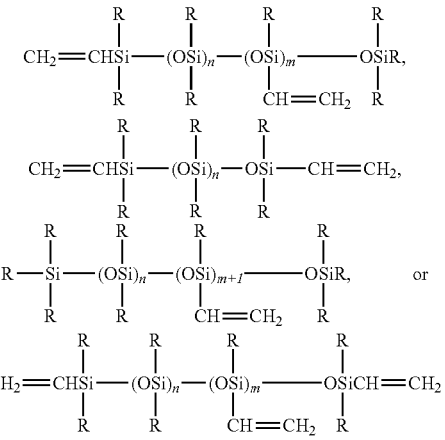

wherein R is the same or different and selected from substituted or unsubstituted monovalent hydrocarbon groups of 1 to 10 carbon atoms excluding alkenyl groups, the subscripts m and n are such integers of m≥1 and n≥0 that the organopolysiloxane has a weight average molecular weight of about 3,000 to about 300,000, component (A) being combined with a vinylmethylsiloxane of resinous structure consisting of $SiO_2$ units, $(CH_3)_3SiO_{0.5}$ units and $(CH_2=CH)(CH_3)_2SiO_{0.5}$ units in an amount of 20 to 70% by weight of component (A),
(B) an organohydrogenpolysiloxane in an amount as to give 0.1 to 5.0 equivalents of silicon-bonded hydrogen atoms per silicon-bonded alkenyl group in component (A),
(C) a platinum group metal based catalyst in an amount to give 0.1 to 1,000 ppm of platinum group metal based on the weight of component (A), and
silica particles having an organopolysiloxane of the general formula (1) grafted to surfaces thereof by previously admitting 100 parts by weight of silica particles and 10 to 50 parts by weight of the organopolysiloxane in a solvent and heating the mixture under reflux at a temperature of 50 to 200° C. for 1 to 50 hours in an amount of 5 to 400 parts by weight per 100 parts by weight of the total of components (A) and (B):

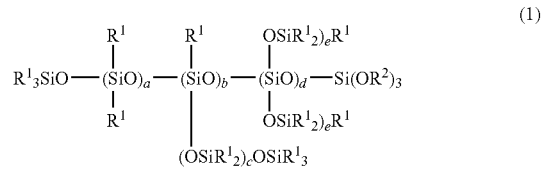
(1)

wherein $R^1$ is each independently a substituted or unsubstituted monovalent hydrocarbon group of 1 to 10 carbon atoms but not alkoxy group, $R^2$ is methyl or ethyl, a is an integer of 1 to 50, b is 0 or 1, d is 0 or 1, c and e each are an integer of 0 to 10, and the sum of a+b+d is an integer of 3 to 52.

17. An optoelectronic device encapsulated with a cured silicone composition, wherein the cured silicone composition is formed by curing a highly transparent silicone composition, which is addition curable comprising:
(A) an alkenyl group-containing organopolysiloxane selected from the following:

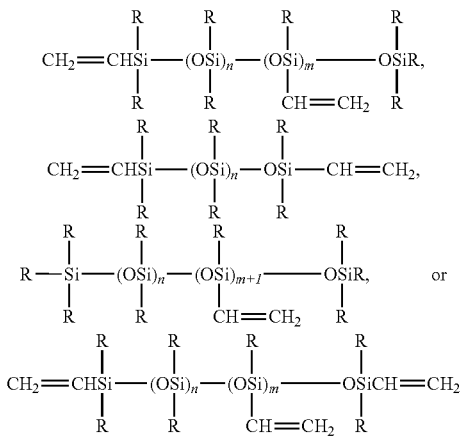

wherein R is the same or different and selected from substituted or unsubstituted monovalent hydrocarbon groups of 1 to 10 carbon atoms excluding alkenyl groups, the subscripts m and n are such integers of m≥1 and n≥0 that the organopolysiloxane has a weight average molecular weight of about 3,000 to about 300,000;
(B) an organohydrogenpolysiloxane in an amount as to give 0.1 to 5.0 equivalents of silicon-bonded hydrogen atoms per silicon-bonded alkenyl group in component (A);
(C) a platinum group metal based catalyst in an amount to give 0.1 to 1,000 ppm of platinum group metal based on the weight of component (A); and
silica particles having an organopolysiloxane of the general formula (1) grafted to surfaces thereof by previously admitting 100 parts by weight of silica particles and 10 to 50 parts by weight of the organopolysiloxane in a solvent and heating the mixture under reflux at a temperature of 50 to 200° C. for 1 to 50 hours in an amount of 5 to 400 parts by weight per 100 parts by weight of the total of components (A) and (B):

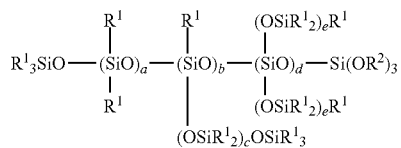

wherein $R^1$ is each independently a substituted or unsubstituted monovalent hydrocarbon group of 1 to 10 carbon atoms but not an alkoxy group, $R^2$ is methyl or ethyl, a is an integer of 1 to 50, b is 0 or 1, d is 0 or 1, c and e each are an integer of 0 to 10, and the sum of a+b+d is an integer of 3 to 52.

18. An optoelectronic device encapsulated with a cured silicone composition, wherein the cured silicone composition is formed by curing a highly transparent silicone composition, which is addition curable comprising:
(A) an alkenyl group-containing organopolysiloxane selected from the following:

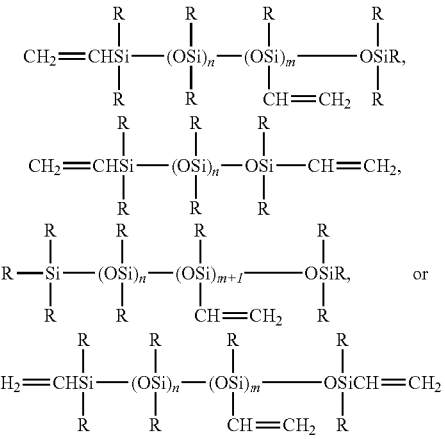

wherein R is the same or different and selected from substituted or unsubstituted monovalent hydrocarbon groups of 1 to 10 carbon atoms excluding alkenyl groups, the subscripts m and n are such integers of m≥1 and n≥0 that the organopolysiloxane has a weight average molecular weight of about 3,000 to about 300,000, component (A) being combined with a vinylmethylsiloxane of resinous structure consisting of $SiO_2$ units, $(CH_3)_3SiO_{0.5}$ units and $(CH_2=CH)(CH_3)_2SiO_{0.5}$ units in an amount of 20 to 70% by weight of component (A),
(B) an organohydrogenpolysiloxane in an amount as to give 0.1 to 5.0 equivalents of silicon-bonded hydrogen atoms per silicon-bonded alkenyl group in component (A),
(C) a platinum group metal based catalyst in an amount to give 0.1 to 1,000 ppm of platinum group metal based on the weight of component (A), and
silica particles having an organopolysiloxane of the general formula (1) grafted to surfaces thereof by previously admitting 100 parts by weight of silica particles and 10 to 50 parts by weight of the organopolysiloxane in a solvent and heating the mixture under reflux at a temperature of 50 to 200° C. for 1 to 50 hours in an amount of 5 to 400 parts by weight per 100 parts by weight of the total of components (A) and (B):

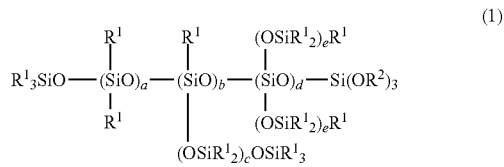

wherein $R^1$ is each independently a substituted or unsubstituted monovalent hydrocarbon group of 1 to 10 carbon atoms but not alkoxy group, $R^2$ is methyl or ethyl, a is an integer of 1 to 50, b is 0 or 1, d is 0 or 1, c and e each are an integer of 0 to 10, and the sum of a+b+d is an integer of 3 to 52.

\* \* \* \* \*